United States Patent
Passlack et al.

[11] Patent Number: 5,902,130
[45] Date of Patent: May 11, 1999

[54] THERMAL PROCESSING OF OXIDE-COMPOUND SEMICONDUCTOR STRUCTURES

[75] Inventors: Matthias Passlack, Chandler; Jonathan K. Abrokwah, Tempe; Zhiyi Jimmy Yu, Gilbert, all of Ariz.

[73] Assignee: Motorola, Inc., Schaumburg, Ill.

[21] Appl. No.: 08/896,234

[22] Filed: Jul. 17, 1997

[51] Int. Cl.[6] .................................................. H01L 21/28
[52] U.S. Cl. .......................... 438/604; 438/608; 438/767
[58] Field of Search .................................... 438/766, 767, 438/703, 762, 604, 608

[56] References Cited

U.S. PATENT DOCUMENTS

| | | | |
|---|---|---|---|
| 4,172,906 | 10/1979 | Pancholy | 427/82 |
| 4,343,870 | 8/1982 | Heller et al. | 429/111 |
| 4,837,175 | 6/1989 | Calviello | 437/24 |
| 4,859,253 | 8/1989 | Buchanan et al. | 148/33.3 |
| 5,597,768 | 1/1997 | Passlack | 437/236 |
| 5,665,658 | 9/1997 | Passlack | 438/763 |

*Primary Examiner*—Charles Bowers
*Assistant Examiner*—Reneé R. Berry
*Attorney, Agent, or Firm*—Eugene A. Parsons

[57] ABSTRACT

A method of thermal processing a supporting structure comprised of various compound semiconductor layers having a Gd free $Ga_2O_3$ surface layer including coating the surface layer with a dielectric or a metallic cap layer or combinations thereof, such that the low $D_{it}$ $Ga_2O_3$-compound semiconductor structure is conserved during thermal processing, e.g. during activation of ion implants of a self aligned metal-oxide-compound semiconductor gate structure. In a preferred embodiment, the semiconductor structure has a surface of GaAs, the Gd free $Ga_2O_3$ layer has a thickness in a range of approximately 1 nm to 20 nm, and the insulating or metallic cap layer has a thickness in a range of approximately 1 nm to 500 nm.

18 Claims, 2 Drawing Sheets

THERMAL PROCESSING OF OXIDE-COMPOUND SEMICONDUCTOR STRUCTURES

FIELD OF THE INVENTION

The present invention pertains to methods of thermal processing of oxide-compound semiconductor structures and more specifically to conservation of low interface state density ($D_{it}$) metal-oxide-compound semiconductor structures during thermal processing of self aligned gate structures.

BACKGROUND OF THE INVENTION

Insulator-semiconductor interfaces are the major workhorse of the Si semiconductor industry. Integration levels of several million metal-oxide-semiconductor (MOS) devices using a minimum feature size <0.3 μm are commonplace. For compound semiconductors, Schottky gates have been used as gate electrodes. Source and drain regions of submicron devices are realized self aligned to the gate by ion implantation in both Si and GaAs very large scale integration (VLSI). The gate structure and, more specifically, the insulator-semiconductor interface must withstand elevated temperatures (700° C.) during thermal processing, in particular during activation of ion implants. The corresponding fabrication techniques and material systems for Si MOSFETs and GaAs Schottky gate FETs are well known to those skilled in the art.

For MOS structures based on compound semiconductors, prior art, for instance M. Passlack et al., Appl. Phys. Lett., vol. 68, 1099 (1996), Appl. Phys. Lett., vol. 68, 3605 (1996), and Appl. Phys. Lett., vol. 69, 302 (1996), U.S. Pat. No. 5,451,548, entitled "Electron Beam Deposition of Gallium Oxide Thin Films using a Single Purity Crystal Source", issued Sep. 19, 1995, and U.S. Pat. No. 5,550,089, entitled "Gallium Oxide Coatings for Optoelectronic Devices Using Electron Beam Evaporation of a High Purity Single Crystal $Gd_3Ga_5O_{12}$ Source", issued Aug. 27, 1996, reported that functional oxide III-V semiconductor interfaces are fabricated by in-situ deposition of a specific insulating layer (e.g. gallium oxide such as $Ga_2O_3$) on gallium arsenide (GaAs) based semiconductor epitaxial layers while maintaining an ultra-high vacuum. The technique provided gallium oxide films with substantial $Gd_2O_3$ and Gd incorporation which increased towards the oxide surface. Full accessibility of the GaAs band gap and interface state densities $D_{it}$ in the low $10^{10}$ cm$^{-2}$eV$^{-1}$ range were demonstrated. The use of an $SiO_2$ cap layer maintained the integrity of the oxide-GaAs interface during rapid thermal annealing of up to 800° C. However, the use of a $SiO_2$ cap layer is incompatible with manufacturable processes as described in the following. The use of a $SiO_2$ cap results in rapid degradation of the oxide-GaAs interface above a temperature of 600° C. when Gd free $Ga_2O_3$ films comprise the gate oxide. Note that a Gd free $Ga_2O_3$ is required for stable and reliable device operation and a process to fabricate Gd free $Ga_2O_3$ films is disclosed in U.S. Pat. No. 5,597,768 entitled "Method of Forming a $Ga_2O_3$ Dielectric Layer", issued Jan. 28, 1997. Further, metal cap layers which conserve the oxide-semiconductor interface are required for a manufacturable self-aligned gate process. Processes using dummy gates are not considered to be manufacturable since the fabrication process is substantially complicated and the integration density is limited.

Prior art also describes a method of making a GaAs MOSFET device using ion implantation (Proc. IEEE International Electron Devices Meeting, pp. 943–945 (1996)). The device, however, does not use a self aligned gate technique and thus, is not manufacturable.

Accordingly, it would be highly desirable to provide a method of thermal processing for a self aligned metal-oxide-compound semiconductor gate structure which conserves a low $D_{it}$ oxide-compound semiconductor structure in particular during activation of ion implants, and a method which is compatible with the requirements in large volume production of highly integrated compound semiconductor MOSFET circuits.

It is a purpose of the present invention to provide a new and improved method of thermal processing for a self-aligned metal-oxide-compound semiconductor gate structure.

It is another purpose of the present invention to provide a new and improved method to conserve a low $D_{it}$ $Ga_2O_3$-compound semiconductor structure during thermal processing, e.g. during activation of implants, for a self-aligned metal-oxide-compound semiconductor gate structure.

It is a further purpose of the present invention to provide a new and improved method to conserve a low $D_{it}$ metal-$Ga_2O_3$-compound semiconductor structure during thermal processing, e.g. during activation of implants, for a self-aligned metal-oxide-compound semiconductor gate structure which is fully compatible with the requirements and established processes in large volume production of highly integrated compound semiconductor circuits.

It is a further purpose of the invention to provide a new and improved method to conserve a low $D_{it}$ metal-$Ga_2O_3$GaAs structure during thermal processing, e.g. during activation of implants, for a self-aligned metal-oxide-compound semiconductor gate structure which is easy to use and manufacture.

SUMMARY OF THE INVENTION

The above problems and others are at least partially solved and the above purposes and others are realized in a method of thermal processing of a supporting structure comprised of various compound semiconductor layers having a Gd free insulating $Ga_2O_3$ surface layer including the step of coating such surface layer with a dielectric cap layer (e.g. silicon nitride, aluminum oxide, etc.) or a metallic cap layer of a refractory metal e.g. W, Ti, WN, TiN or combinations thereof such that the low $D_{it}$ $Ga_2O_3$-compound semiconductor structure is conserved during thermal processing, e.g. during activation of ion implants of a self aligned metal-oxide-compound semiconductor gate structure.

In a preferred embodiment the semiconductor layer structure has a surface of GaAs, the Gd free $Ga_2O_3$ layer has a thickness in a range of approximately 1 nm to 20 nm, and the insulating or metallic cap layer has a thickness in a range of approximately 1 nm to 500 nm.

The deposition of the insulating or the refractory metal cap layer can be performed by any one of physical vapor deposition, chemical vapor deposition, and sputtering.

BRIEF DESCRIPTION OF THE DRAWINGS

Referring to the drawings.

DESCRIPTION OF THE PREFERRED EMBODIMENT

Figure 1:
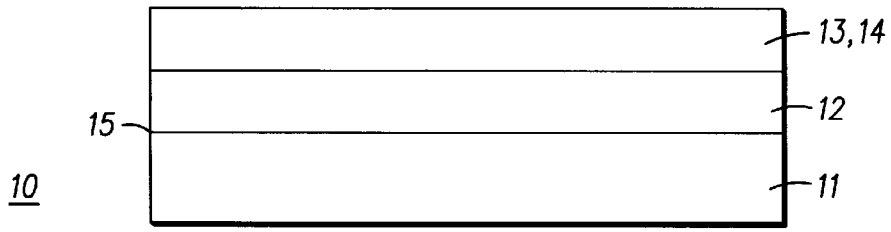
FIG. 1 is a cross sectional view of a $Ga_2O_3$-compound semiconductor structure incorporating the present invention.

Referring specifically to FIG. 1 a simplified cross sectional view of a $Ga_2O_3$-compound semiconductor structure 10 incorporating the present invention is illustrated. In this simplified form, the structure includes a semiconductor substrate 11, a Gd free $Ga_2O_3$ layer 12 deposited on the upper surface of substrate 11, a metallic cap layer 13 or an insulating cap layer 14 deposited on the upper surface of $Ga_2O_3$ layer 12, and a low $D_{it}$ $Ga_2O_3$-compound semiconductor interface 15.

Figure 2:
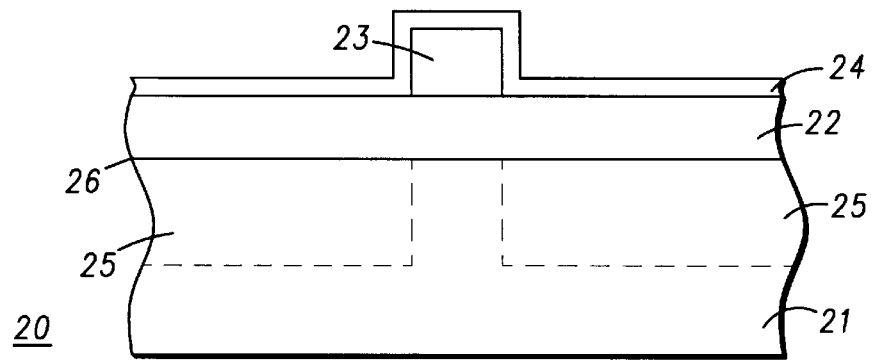
FIG. 2 is a cross sectional view of a self aligned $Ga_2O_3$-compound semiconductor gate structure incorporating the present invention.

Referring specifically to FIG. 2 a simplified cross sectional view of a self aligned metal-$Ga_2O_3$-compound semiconductor gate structure 20 incorporating the present invention is illustrated. In this simplified form, the gate structure includes a substrate 21, a Gd free $Ga_2O_3$ layer 22 deposited on the upper surface of substrate 21, a metallic cap layer 23 deposited on portions of the upper surface of $Ga_2O_3$ layer 22, an insulating cap layer 24 deposited on the remaining portions of the upper surface of $Ga_2O_3$ layer 22 and deposited on the surface of metallic cap layer 23, source and drain implants 25 realized self aligned to the gate, and a low $D_{it}$ $Ga_2O_3$-compound semiconductor interface 26. In general, the insulating or metallic cap layer is chosen such that the low $D_{it}$ $Ga_2O_3$-compound semiconductor interface is conserved during thermal processing, e.g. during activation of ion implants. In a preferred embodiment, the insulating cap layer 13 and 23 comprises silicon nitride or aluminum oxide, the metallic cap layer 14 and 24 comprises a refractory metal e.g. W, WN, or TiWN. In a further preferred embodiment, the Gd free $Ga_2O_3$ layer has a thickness in a range of approximately 1 nm to 20 nm, and the insulating or metallic cap layer has a thickness in a range of approximately 1 nm to 500 nm. All of the various layers and implants are formed in a well known manner and may be formed in any sequence convenient to the specific device and fabrication technique utilized. The cap layers 13, 14, 23, and 24 may be removed by selective etching after thermal processing if required by the specific application.

In general, substrate 11 and 21 comprises various layers of III-V material such as gallium arsenide and related material systems so as to be crystalographically coupled. This is accomplished, as is known in the art, by epitaxially growing the various layers in sequence in a standard growth chamber.

Figure 3:
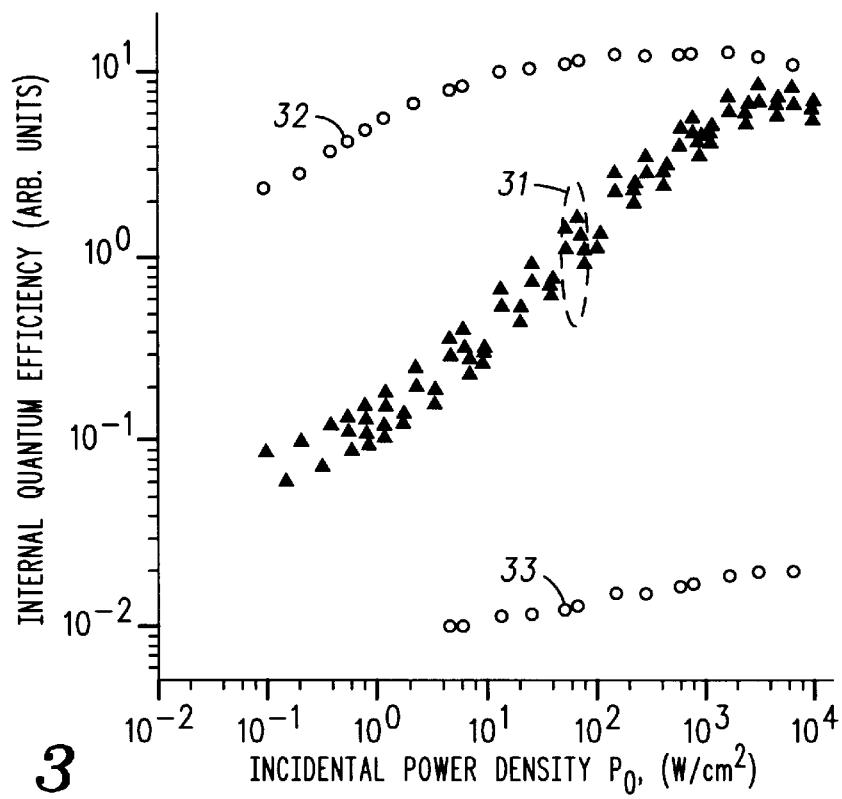
FIG. 3 is a graph illustrating the low $D_{it}$ property of the $Ga_2O_3$-GaAs interface.

Referring now to FIG. 3, the low $D_{it}$ property of the as deposited $Ga_2O_3$-GaAs interface is illustrated. The low $D_{it}$ property of the as deposited $Ga_2O_3$-GaAs interface is well known in prior art and the interface is here characterized by a photoluminescence-power spectroscopy technique where the curves in FIG. 3 show the measured dependence of the quantum efficiency $\eta$ (arb. units) on the laser excitation density P0'. Curves 31 show the $\eta$-P0' dependence for as deposited $Ga_2O_3$-GaAs interfaces, curve 32 for an AlGaAs-GaAs reference interface, and curve 33 for a bare reference sample. The interface state density $D_{it}$ is in a range of approximately $10^{10}$ $eV^{-1}cm^{-2}$ to $10^{11}$ $eV^{-1}cm^{-2}$ and approximately $5\times10^{13}$ $eV^{-1}cm^{-2}$, respectively.

Figure 4:
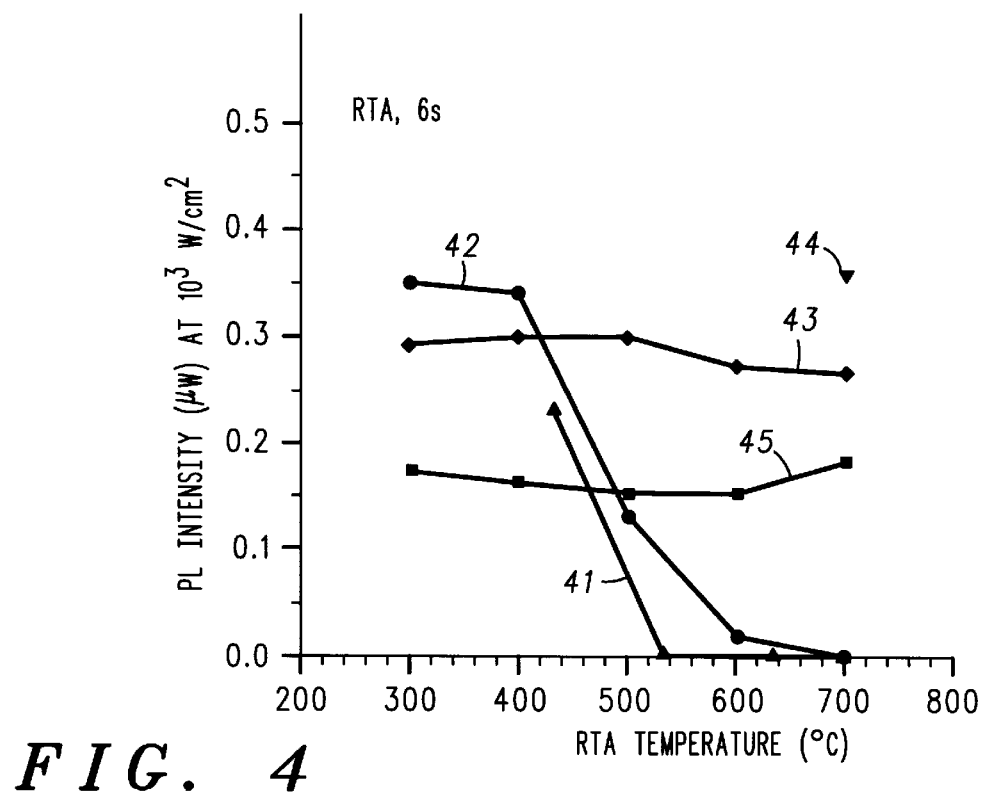
FIG. 4 is a graph illustrating the thermal stability of a low $D_{it}$ $Ga_2O_3$-GaAs interface using no cap layer, an insulating cap layer or a metallic cap layer during thermal processing according to the present invention.

Referring now to FIG. 4, the measured photoluminescence intensity measured here for the excitation power density of approximately 1 $kW/cm^2$ is shown as a function of temperature (300° C. to 700° C.) during thermal processing and more specifically, as a function of temperature during rapid thermal annealing (RTA). Curve 41 depicts the case of using no cap layer (for example, substrate 11 and a Gd free $Ga_2O_3$ layer 12 deposited on the upper surface of substrate 11), curve 42 of using a 25 nm thick $SiO_2$ cap layer (for example, deposited on the upper surface of $Ga_2O_3$ layer 12), curve 43 of using a 25 nm thick silicon nitride cap layer (for example, deposited on the upper surface of $Ga_2O_3$ layer 12), curve 44 of using a 300 nm thick W cap layer (for example, deposited on the upper surface of $Ga_2O_3$ layer 12), and curve 45 of using a 300 nm thick TiWN cap layer (for example, deposited on the upper surface of $Ga_2O_3$ layer 12). In general, the conservation of a low $D_{it}$ $Ga_2O_3$-GaAs interface is characterized by a high photoluminescence intensity and a photoluminescence signal of approximately zero indicates a completely destroyed interface as shown in FIG. 4.

Figure 5:
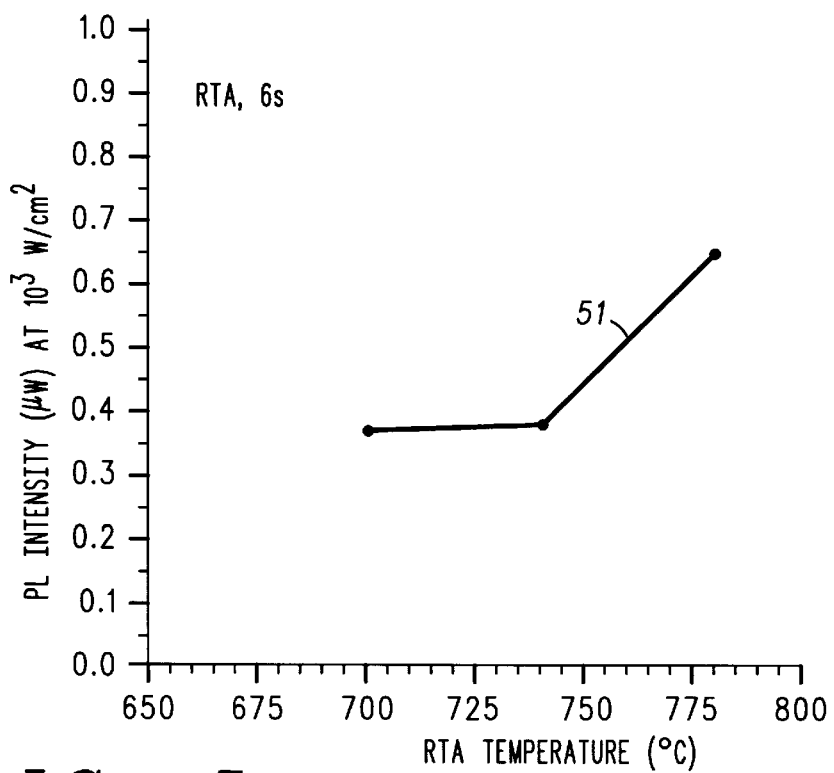
FIG. 5 is another graph illustrating the thermal stability of a low $D_{it}$ $Ga_2O_3$-GaAs interface using an insulating cap layer according to the present invention.

Referring now to FIG. 5, the measured photoluminescence intensity is shown as a function of temperature during rapid thermal annealing in a narrow temperature range from 700° C. to 780° C. Curve 51 depicts the case of using a 50 nm thick silicon nitride cap layer which is, for example, deposited on the upper surface of $Ga_2O_3$ layer 12.

It can be seen from FIGS. 4 and 5, that the use of an insulating or metallic cap layer which is, for example deposited on the upper surface of $Ga_2O_3$ layer 12, extends the temperature range of $Ga_2O_3$-GaAs interface stability significantly. As demonstrated here, the use of an insulating cap layer (for example silicon nitride or aluminum oxide) or the use of a metallic cap layer (for example, W, Ti, WN, TiN or combinations thereof) provide stability of the low $D_{it}$ $Ga_2O_3$-GaAs interface at temperatures occurring during thermal processing and more specifically, at temperatures required for annealing of species implanted into the semiconductor substrate 11 or 21 (700° C.–780° C. in GaAs and related semiconductors). The use of the described metallic and insulating cap layers is fully compatible with the fabrication of a self aligned metal-oxide-compound semiconductor gate structure since the refractory metal is used as a gate electrode in the finished device.

Thus, a new and improved method to conserve a low $D_{it}$ $Ga_2O_3$-compound semiconductor structure during thermal processing, e.g. during activation of implants, is disclosed. The new and improved process is fully compatible with the fabrication of self-aligned metal-oxide-compound semiconductor gate structures and with the requirements and established processes in large volume production of highly integrated compound semiconductor circuits.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of using a cap layer on a supporting structure comprising the steps of:

providing a supporting structure consisting of III-V compound semiconductor material in immediate contact with a Gd free $Ga_2O_3$ surface layer and having a low $D_{it}$ $Ga_2O_3$-compound semiconductor interface; and depositing a cap layer of insulating or metallic material on the GD free $Ga_2O_3$ surface layer such that the low $D_{it}$ $Ga_2O_3$-compound semiconductor interface is conserved during subsequent thermal processing.

2. A method of using a cap layer on a supporting structure as claimed in claim 1 wherein the insulating cap layer is formed of silicon nitride or aluminum oxide.

3. A method of using a cap layer on a supporting structure as claimed in claim 2 wherein the cap layer of silicon nitride or aluminum oxide is formed to a thickness equal to or greater than 0.3 nm with a preferred range of 5 nm to 5000 nm.

4. A method of using a cap layer on a supporting structure as claimed in claim 1 wherein the cap layer is formed of metallic material, and more specifically of refractory metals such as W, Ti, WN, TiN or mixtures thereof.

5. A method of using a cap layer on a supporting structure as claimed in claim 4 wherein the metallic cap layer is formed to a thickness equal or greater than 0.3 nm with a preferred range of 5 nm to 5000 nm.

6. A method of using a cap layer on a supporting structure as claimed in claim 1 wherein the cap layer is formed using a combination of a metallic cap layer and an insulating cap layer.

7. A method of using a cap layer on a supporting structure as claimed in claim 6 wherein the metallic cap layer and insulating cap layer are formed to a thickness equal or greater than 0.3 nm with a preferred range of 5 nm to 5000 nm.

8. A method of using a cap layer on a supporting structure as claimed in claim 1 wherein the supporting structure and the cap layer are included in a gate structure.

9. A method of using a cap layer on a supporting structure as claimed in claim 8 wherein the gate structure is a self aligned gate structure.

10. A method of using a cap layer on a supporting structure comprising the steps of:

providing a supporting structure consisting of III-V compound semiconductor material in immediate contact with a Gd free $Ga_2O_3$ surface layer and having a low $D_{it}$ $Ga_2O_3$-compound semiconductor interface; and depositing a cap layer of insulating or metallic material on the Gd free $Ga_2O_3$ surface layer such that the low $D_{it}$ $Ga_2O_3$-compound semiconductor interface is conserved during subsequent activation of species implanted into the supporting structure.

11. A method of using a cap layer on a supporting structure as claimed in claim 10 wherein the cap layer is formed of insulating material including silicon nitride or aluminum oxide.

12. A method of using a cap layer on a supporting structure as claimed in claim 11 wherein the cap layer of silicon nitride or aluminum oxide is formed to a thickness equal or greater than 0.3 nm with a preferred range of 5 nm to 5000 nm.

13. A method of using a cap layer on a supporting structure as claimed in claim 10 wherein the cap layer is formed of metallic material including a refractory metal.

14. A method of using a cap layer on a supporting structure as claimed in claim 13 wherein the cap layer is formed of W, Ti, WN, TiN or mixtures thereof.

15. A method of using a cap layer on a supporting structure as claimed in claim 13 wherein the metallic cap layer is formed to a thickness equal or greater than 0.3 nm with a preferred range of 5 nm to 5000 nm.

16. A method of using a cap layer on a supporting structure as claimed in claim 10 wherein the cap layer is formed using a combination of metallic and insulating materials.

17. A method of using a cap layer on a supporting structure as claimed in claim 10 wherein the supporting structure and the cap layer are included in a gate structure.

18. A method of using a cap layer on a supporting structure as claimed in claims 17 wherein the gate structure is a self aligned gate structure.

* * * * *